United States Patent [19]

Joos et al.

[11] Patent Number: 5,430,438

[45] Date of Patent: Jul. 4, 1995

[54] METHOD AND DEVICE FOR FUNCTIONAL MONITORING OF AN ELECTRICAL LOAD

[75] Inventors: Eugen Joos, Freiberg; Eberhard Bauer, Ludwigsburg, both of Germany

[73] Assignee: Robert Bosch GmbH, Munich, Germany

[21] Appl. No.: 309,349

[22] Filed: Sep. 20, 1994

Related U.S. Application Data

[63] Continuation of Ser. No. 916,825, Aug. 12, 1992, abandoned.

[30] Foreign Application Priority Data

Feb. 22, 1990 [DE] Germany ............... 40 05 609.0

[51] Int. Cl.⁶ .............. G05B 23/02; G08C 19/16; G01M 15/00; G01R 31/02
[52] U.S. Cl. .............. 340/825.160; 340/870.190; 73/119 A; 364/483; 324/522
[58] Field of Search .............. 340/825.16, 870.19, 340/635, 650, 651, 652, 653; 324/522, 523, 527, 533, 546; 73/119 A; 364/431.11, 483

[56] References Cited

U.S. PATENT DOCUMENTS

| | | | |
|---|---|---|---|
| 4,136,333 | 1/1979 | Sumida et al. | 340/825.16 |
| 4,178,542 | 12/1979 | McCarthy | 340/653 |
| 4,529,970 | 7/1985 | Wynne | 340/652 |
| 4,574,266 | 3/1986 | Valentine | 340/635 |
| 4,654,645 | 3/1987 | Yamagishi | 340/635 |
| 4,764,884 | 8/1988 | Noyori | 340/635 |
| 4,766,386 | 8/1988 | Oliver et al. | 324/533 |
| 4,932,246 | 6/1990 | Deutsch et al. | 73/119 A |
| 4,945,297 | 7/1990 | Coustre | 340/825.16 |
| 5,063,516 | 11/1991 | Jamoua et al. | 340/635 |
| 5,161,112 | 11/1992 | Guerra et al. | 364/483 |
| 5,172,588 | 12/1992 | Umemoto | 73/119 A |
| 5,173,832 | 12/1992 | Giorgetta et al. | |
| 5,203,868 | 4/1993 | Ono | 324/546 |

OTHER PUBLICATIONS

Graf; *Electronic Data Book*; 1983; TAB Books Inc.; USA; pp. 108–111.

ITT; *Reference Data for Radio Engineers*; 1975; H. W. Sains+Co. Inc.; USA; pp. 6–10, 11; 8–4; 13; 23–11.

Metzger; *Electronics Pocket Handbook*; 1982; Prentice-Hall Inc.; USA; pp. 4–9.

*Primary Examiner*—Donald J. Yusko
*Assistant Examiner*—Mark H. Rinehart
*Attorney, Agent, or Firm*—Kenyon & Kenyon

[57] ABSTRACT

A method for functional monitoring of an electrical load, controlled by a control circuit, provides that defects in the load are detected by comparison of a signal which is used to control the load and a status signal which is passed back to the control circuit from the load. A short-circuit to ground or to the supply voltage and a cable failure can be confirmed by logical evaluation of the signals before, during and after a switching event. In this case, it is possible to differentiate between the individual defect cases.

11 Claims, 5 Drawing Sheets

METHOD AND DEVICE FOR FUNCTIONAL MONITORING OF AN ELECTRICAL LOAD

This is a continuation of application Ser. No. 07/916,825 filed on Aug. 12, 1991, now abandoned.

FIELD OF THE INVENTION

The present invention relates to a method for functional monitoring of an electrical load controlled by a control circuit and to a device for functional monitoring of an electrical load.

BACKGROUND OF THE INVENTION

In a known functional monitoring method, the monitoring of a load takes place with the aid of so-called transistor monitoring. In this case, it is possible to determine whether the transistor which is used as a switch is "high" or "low" and whether there is a short-circuit of the supply line of the electrical load to the supply voltage or to ground. An interruption in the supply line to the load cannot additionally be detected without an increased circuit cost.

Functional monitoring by means of a switching IC is also known. However, in this method it is not possible to detect which defect is present, that is to say whether there is a short-circuit of the line leading to the load to the supply voltage or to ground, or whether there is a line interruption.

Finally, a method for functional monitoring is also known, in which an intelligent diagnosis IC is used. In this case, it is possible to directly differentiate between the switching states of the switch allocated to the load, a short-circuit of the line leading to the load to the supply voltage or to ground, and a line interruption. However, the cost of defect detection with such monitoring is very high. The information about a defect can be coded, for example via a serial interface, and read out on demand.

SUMMARY OF THE INVENTION

The method according to the present invention and the associated device have the advantage that the functioning of an electrical load can be optimally monitored with a very low hardware cost. Since a plurality of comparison interrogations take place sequentially in time, defects can be detected with high reliability without an increased hardware cost.

In principle, the comparison of the control signal with the status signal can take place at any desired times, although it is preferably provided that the comparison interrogation is carried out before, during and after a switching event. In this case, a switching event is understood to mean the active switching state of the load controlled by the control circuit. Consequently, the interrogation time can be defined very easily.

An embodiment of the device of the present invention includes a control circuit that is connected to an electrical load. The control circuit has control logic that has an input port, an output port, and a time control circuit (for controlling interrogation of the potentials at the input port, output port, and a control terminal). The device further includes the control terminal, which connects to the electrical load and the control logic; a comparator circuit, which connects to input port, a time-constant circuit, the control terminal, and an output stage; and the output stage which connects to the output port, the control terminal, the time-constant circuit, and the comparator circuit.

In a preferred embodiment of the method according to the present invention, especially for detecting a cable failure or a line interruption, the evaluation of the interrogation results of a case event is extended to the interrogation results of the subsequent switching event. In this way, it is possible to differentiate particularly easily between a cable failure or a line interruption and a short-circuit to the supply voltage or a short-circuit to ground.

According to the present invention, the time control circuit ensures that the control signal is compared with the status signal at the desired times. A short-circuit to the supply voltage or to ground can thus be confirmed very easily.

Following the present invention, an RC element allocated to the status signal is provided. If a defect is confirmed by an interrogation after the switching event, it is thus possible to take into account the subsequent comparison interrogations of the following switching event for defect evaluation and determination. Consequently, it is possible to differentiate between a cable failure or a line break and a short-circuit to the supply voltage.

It is particularly advantageous that only a very low hardware cost is required for functional monitoring.

DETAILED DESCRIPTION OF THE DRAWINGS

The method described in the following text and the device for functional testing of an electrical load can be used universally. For example, they can be used for functional testing of electrical units of a motor vehicle. As a rule, such units are controlled by electrical switches, for example by power transistors, it being possible for the switch to be connected to ground or to the supply voltage. The functional test can be carried out in both cases.

Figure 1:
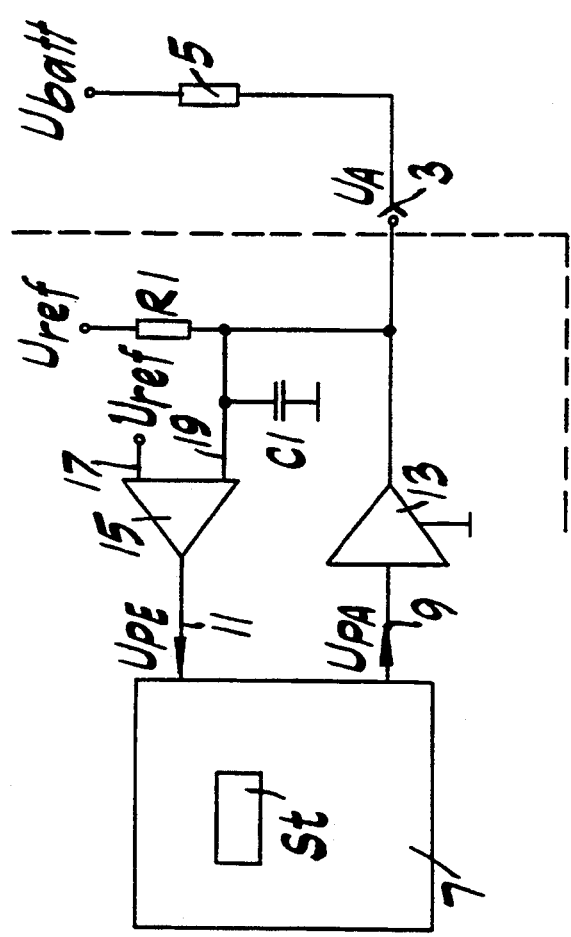
FIG. 1 shows an outline circuit of a device for functional monitoring of an electrical load.

FIG. 1 shows an outline circuit diagram of a control circuit 1, used for functional monitoring, having an output terminal designated as control terminal 3. An electrical load 5, which is connected to a supply voltage designated as $U_{batt}$, is connected to said control terminal 3.

The control circuit comprises an internal control and evaluation logic device 7, which, inter alia, has an output port 9 and an input port 11. Between the output port 9 and the control terminal 3, there is an output stage 13, which can be implemented, for example, by a power transistor. In the active switching state, in this embodiment, the load 5 is connected by the output stage 13 to ground. The following versions also apply in the same sense to a load which is connected to ground and is connected by the associated output stage, in the active switching state, to the supply voltage.

For its part, the input port 11 is connected via a comparator circuit 15 to the control terminal 3. The first input 17 of the comparator circuit is connected to a reference voltage $U_{ref}$, while its second input 19 is connected to the control terminal 3. Allocated to the second input 19 is an RC element, whose resistor R1 is connected on the one hand to a reference voltage source $U_{ref}$ and on the other hand to the second input 19, and whose capacitor C1 is connected on the one hand, for example, to ground and on the other hand likewise to the second input 19.

The control logic device 7 on the one hand emits via the output port 9 a signal $U_{PA}$, which is used for controlling the electrical load 5 via the control terminal 3. On the other hand, a signal $U_{PE}$ is reported back from the control terminal 3 to the control logic device 7, which signal is applied to the input port 11 of the control logic device. In this case, the status signal is evaluated in the comparator circuit 15.

The control logic device 7 comprises a time control circuit St which controls the interrogation of the potentials on the input and output ports 9 and 11 and on the control terminal 3 of the control apparatus. The time control circuit can also be implemented by software. The interrogation is coordinated with the switching events such that a plurality of interrogations take place one after another, preferably before, during and after a switching event.

The control apparatus 1, indicated by a dotted line, is not reproduced completely here. For reasons of improved clarity, amplifier stages, interface circuits and protection components which are otherwise still present have been omitted.

Figure 2:
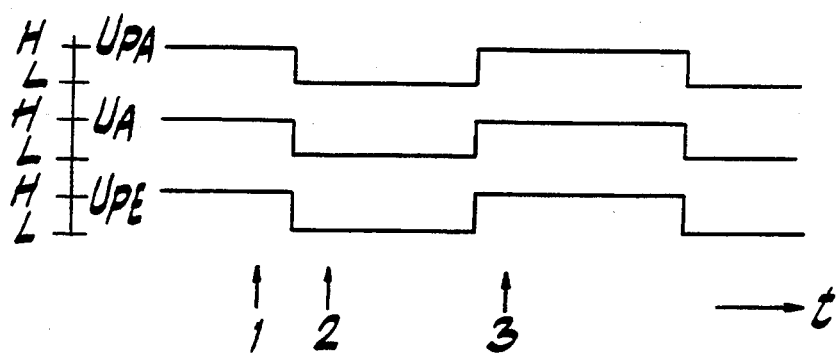
FIG. 2 shows the behavior of the potential on the output terminal of the control apparatus, on the input terminal of the electrical load, and of the status signal for different functional states of the electrical load.
Figure 2:
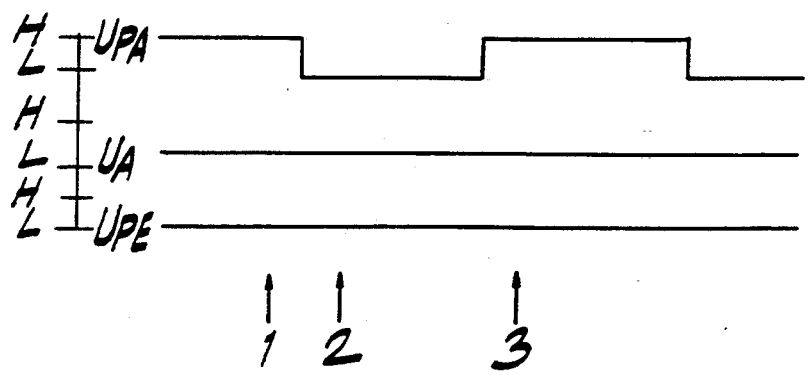
Figure 2:
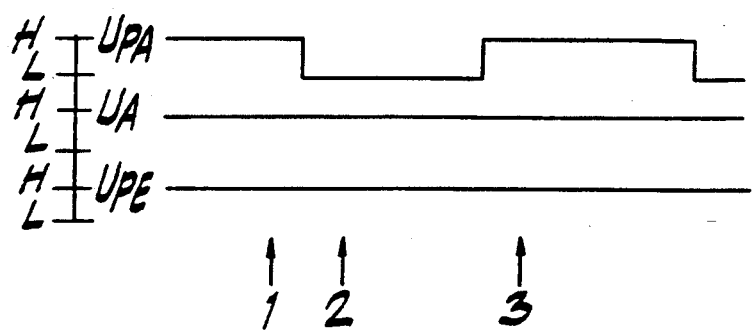
Figure 2:
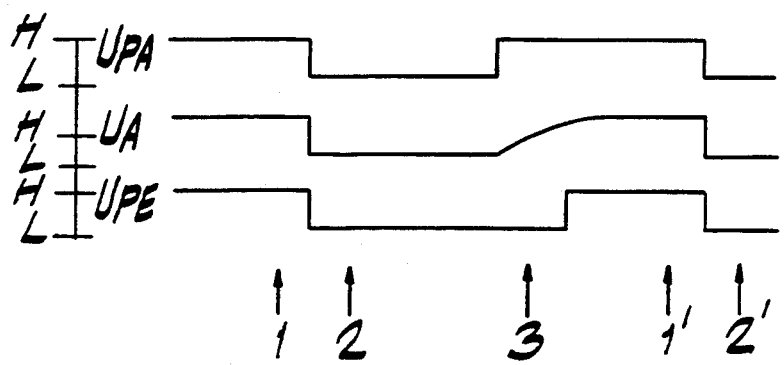

FIG. 2 shows the principle of functional monitoring. To this end, this figure shows four diagrams, one above another, from which the time behavior of the potential on the output port 9, on the control terminal 3, and on the input port 11 results. In addition, times at which the potentials on said terminals are interrogated are designated by "1", "2" and "3". The potential on the control terminal 3 is marked by $U_A$, on the input port 11 by UPE, and on the output port 9 of the control logic device 7 by $U_{PA}$.

It is assumed in the representation that the signals are connected between the output port to the unit and back to the input port in a non-inverting manner. A switching event can be detected here in that the potential on the output port is reduced for a predetermined time period.

The topmost diagram in FIG. 2 shows the behavior of the potential for the case where no defect is present. It can be seen that the potentials on the input and output port and on the control terminal have the same behavior. The signals thus correspond logically at the interrogation times "1", "2" and "3".

In the diagram underneath this, according to FIG. 2, a defect case is shown, namely a short-circuit of the load 5 to ground. Consequently, the potential on the control terminal 3 and on the input port 9 does not change even when the potential of the control signal applied to the control port 9 changes. The potentials on the output terminal and on the input port 11 of the control logic device 7 are always at ground at the interrogation times "1", "2" and "3".

The third diagram of FIG. 2 shows the behavior of the potential on the output port 9, on the control terminal 3, and on the input port 11. However, in this case a further defect case is shown, namely a short circuit of the electrical load 5 to the supply voltage, that is to say in this case to $U_{batt}$. It can be seen that a switching event takes place at the output port 9 of the control logic device 7. However, the potential on the control terminal 3 remains unchanged at $U_{batt}$. The potential on the input port 11 of the control logic device 7 likewise does not change; it likewise remains unchanged at $U_{batt}$.

The fourth diagram according to FIG. 2 shows a further defect case. In addition to the behavior of the potential on the control port 9 of the control logic device 7, the behavior of the potential on the output terminal 3 and on the input port 11 receiving the status signal is shown. In this case, it is assumed that the electrical connection between the control apparatus 1 and the electrical load 5 is interrupted by a cable/connector failure or by a line break.

There are still no deviations from defect-free operation at the interrogation times "1" and "2". The potentials on the output terminal 3 and on the input port 11 follow the potential on the output port 9. However, when the potential on the output port 9 of the control logic device 7 returns to its original value, it can be seen that the potentials on the control terminal 3 and on the input port 11 do not directly follow the potential on the output port 9, at the end of the switching event. The evaluation of the signals leads to the result that a defect case is present at interrogation time "3", from which it could also be concluded, in principle, that there is now a short-circuit to ground.

In the functional monitoring method according to the present invention, because of the defect at interrogation time "3", it is ensured that the results of the interrogation of the subsequent switching event are used for determining the defect present, for precise determination of the defect case present. This means that the interrogation results at the times "1'" and "2'", which are allocated to the subsequent switching events, are used for evaluation of the defect which is present at time "3".

The RC element is provided in order to be able to differentiate between an interruption in the connection between the control apparatus 1 and the electrical load 5, and a short-circuit to ground. In this case, the resistance value of R1 is significantly greater than the resistance of the electrical load connected to the control terminal 3. This leads to the capacitor C1 having a significantly shorter charging time constant with the resistance of the electrical load than with the resistance of the resistor R1 of the RC element. The different charging behaviors of the capacitor C1 are detected by the comparator circuit 15, which has a threshold value comparator. In the defect case, there is a time-delayed report back of the switching-off process of the output stage 13. There is still no confirmation of the switching-off process at time "3". This confirmation does not occur until interrogation time "1'" of the subsequent switching event. Because of this time delay in the confirmation of the switching-off process, it is possible to reliably differentiate between a line interruption between the control apparatus 1 and the electrical load 5, and a short-circuit of the control terminal 3 to ground, as is shown in the second diagram according to FIG. 2.

Figure 3:
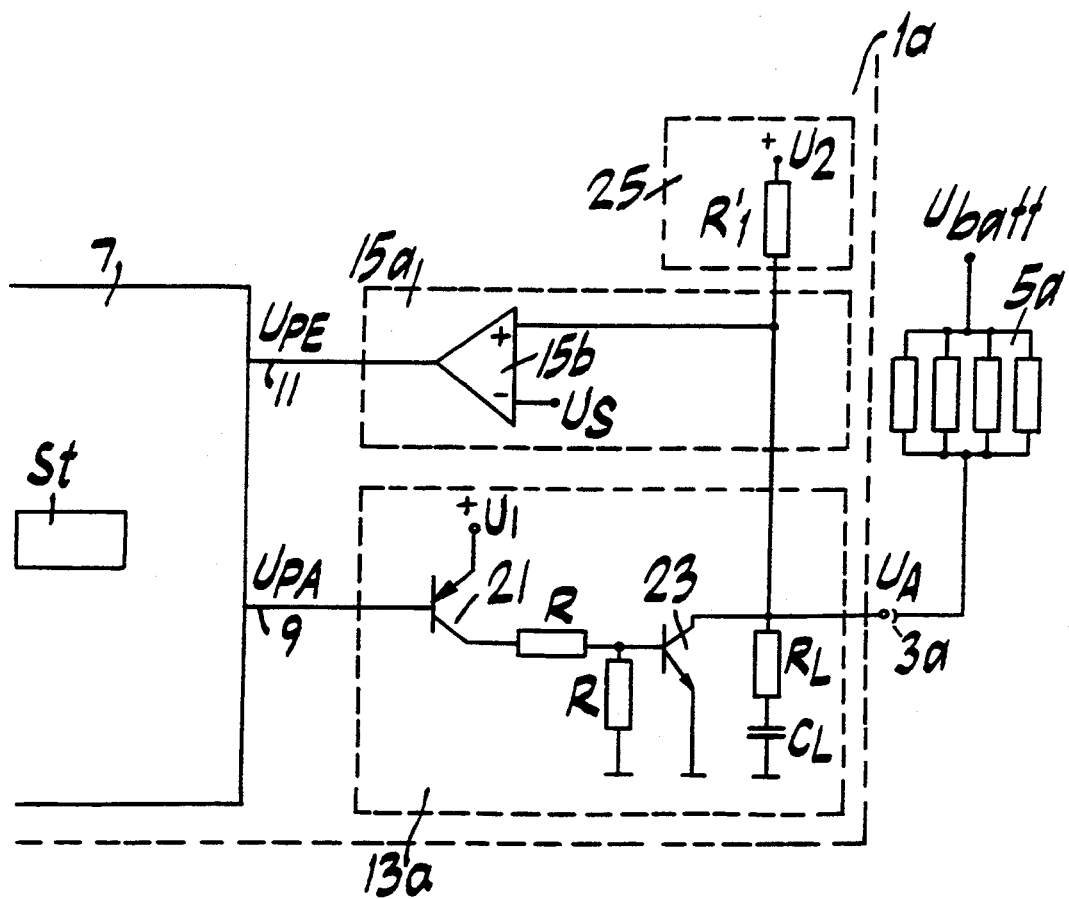
FIG. 3 shows a device for monitoring injection valves in an internal-combustion engine.

FIG. 3 shows a first embodiment of a device for functional monitoring of an electrical load. Identical parts are here provided with identical reference symbols.

The control apparatus 1a, which is indicated here by a dotted line, is used for controlling an electrical load 5a via a control terminal 3a.

By way of example, four injection valves of an internal-combustion engine are indicated here as the electrical load.

Via its output port 9, the control logic device 7 controls an output stage 13a, which is used for controlling the injection valves. Said output stage 13a has a first transistor 21 whose base is connected to the output port 9. Its emitter is connected to a supply voltage, for example to $+U_1$. Its collector is connected via a voltage divider having two resistors R to the base of a second transistor 23. Said base is connected to the junction of the two resistors. The voltage divider is connected on the one hand to the collector of the first transistor 21 and on the other hand to ground. The emitter of the second transistor 23 is likewise connected to ground. Its collector is connected to the control terminal 3a.

A series circuit, which consists of a resistor $R_L$ and $C_L$ and is connected between the collector of the second transistor 23 and ground, is provided to suppress the inductive switching-off surge of the injection valves. The resistance value of the resistor $R_L$ is insignificant for functional monitoring, since it is negligibly small.

A comparator circuit 15a, which has a comparator 15b, is connected to the input port 11 of the control logic device 7 which receives the status signal. A connection to the control terminal 3a is connected to the first input of said comparator 15b, a threshold value or comparator voltage $U_s$ is connected to its second input.

Finally, the control apparatus 1a is provided with a time-constant circuit 25, which comprises a resistor $R'_1$, which is connected to a supply voltage $+U_2$ and to the control terminal 3a. $R_L$ is negligibly small in comparison with the resistor $R'_1$. The following condition $(R'_1+R_L) >> (R5a+R_L)$ applies, the resistance of the load being designated by R5a.

The resistor $R'_1$ of the time-constant circuit, together with the capacitor $C_L$ of the suppression circuit in the output stage 13a forms an RC element. In this case, the capacitor $C_L$ corresponds to the capacitor $C_1$ in FIG. 1.

The functional monitoring method by means of which the injection valves used as the electrical load 5a are monitored corresponds to the method explained referring to FIG. 2.

The potentials on the control terminal 3a, the input port 11, and on the output port 9 of the control logic device 7 are compared with one another at given times "1", "2" and "3". As long as the logical correlation matches, there is no defect. It is possible to differentiate between short-circuits to the supply voltage and to ground directly. This results from the second and third diagrams in FIG. 2 and the associated explanations.

If there is a cable failure or a line interruption in the common control line of the injection valves, this can be detected by the RC element. Thus if, as at interrogation time "3" in the lowermost diagram according to FIG. 2, the potential on the input terminal 11 has not yet fallen back to the original value, the potentials on this terminal and on the control terminal 3a are interrogated, to be precise at time "1'" of the subsequent switching event. In this way, a cable failure can clearly be differentiated from a short-circuit to ground.

Figure 4:
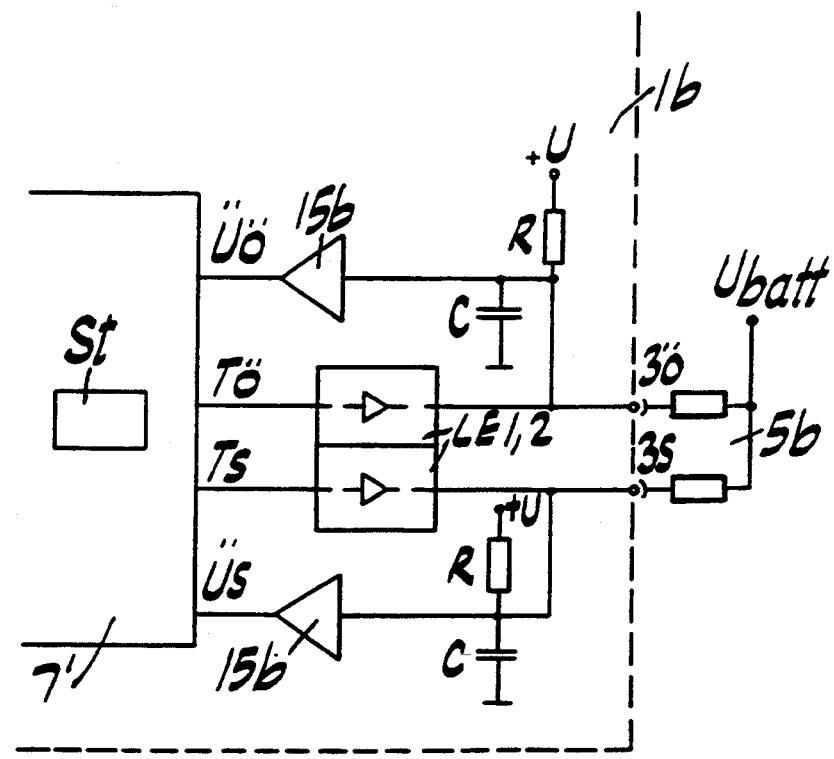
FIG. 4 shows a device for monitoring a two-winding rotary actuator.

FIG. 4 shows that the functional monitoring principle can also be used for a bipolar load, for example for a two-winding rotary actuator. The control of this load results from this figure, parts which correspond to those in FIGS. 1 or 3 being provided with the same reference symbols. A comprehensive description of these can be omitted here.

The control apparatus 1b, which is once again shown dotted, in this case has two control terminals 3ö and 3s, to which the windings of a two-winding rotary actuator 5b are connected, which windings are connected on the other hand to a supply voltage, in this case to $U_{batt}$.

A control logic device 7' has a first output or clock port Tö and a second output or clock port Ts; both are allocated to power output stages LE1 and LE2. In the embodiment shown, the power output stage LE1 is connected to the control terminal 3ö and the power output stage LE2, allocated to the clock port Ts, is connected to the control terminal 3s.

Each of the control terminals is connected via a comparator circuit 15b, which is only indicated here, to a reporting back input of the control logic device 7', the control terminal 3ö in this case having allocated to it a monitoring input Üö and the control terminal 3s having allocated to it a monitoring input Üs.

Furthermore, an RC element is allocated to each of the two control terminals 3ö and 3s, a series circuit consisting of a resistor and a capacitor being connected on the one hand to a supply voltage $+U$ and on the other hand also to ground, and the control terminal being connected to the junction point between the resistor and the capacitor. The RC elements are used to confirm a cable failure or an interruption in the supply lines to the load 5b. The capacitors, which are provided separately here, may then be omitted if, for example, suppression circuits are provided which have a capacitor which prevents RF signals and interference surges.

Instead of the two separate output ports Tö and Ts, a common output port T can be provided, whose output signal is passed directly to the one power output stage, for example to LE1, and whose output signal is supplied via an invertor to the other power output stage, that is to say LE2.

Instead of the two input ports Üö and Üs, it is also possible to provide an input port of the control logic device 7' to which the status signals of the control terminals 3ö and 3s are applied in a common manner. In this case, the output signals of the comparators can be weighted via suitable resistance values.

Figure 5:
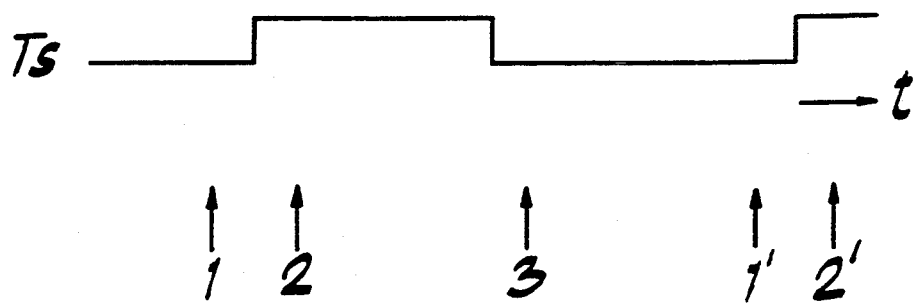
FIG. 5 shows a diagram illustrating the behavior of the potential on the output terminals of a control logic device of a control apparatus for a bi-directional load.

In this circuit, functional monitoring takes place in principle according to the method described above. In FIG. 5, the interrogation times "1", "2" and "3" are applied to the clock ports Tö and Ts over the behavior of the potential. It can be seen from FIG. 5 that the potentials on the clock ports Tö and Ts are in opposite phase. The first switching event is introduced on the first voltage drop on the clock port Tö, in that a timer is charged. After a predetermined time, the potential on Tö returns to its original value, and the switching event is terminated. The inverted behavior of the potential results for Ts.

A cable failure can be detected by Ts at the interrogation time "2" if to be precise, the potential on Ts does not rise to the predetermined value at the correct time. In the reverse manner, a cable failure can be confirmed at the port Tö at interrogation time "3" if the potential does not reach the predetermined value at this time. As described above, for this case, the result of the interrogation times "1'" and "2'" of the subsequent switching event is used for evaluating this defect case.

Figure 6:
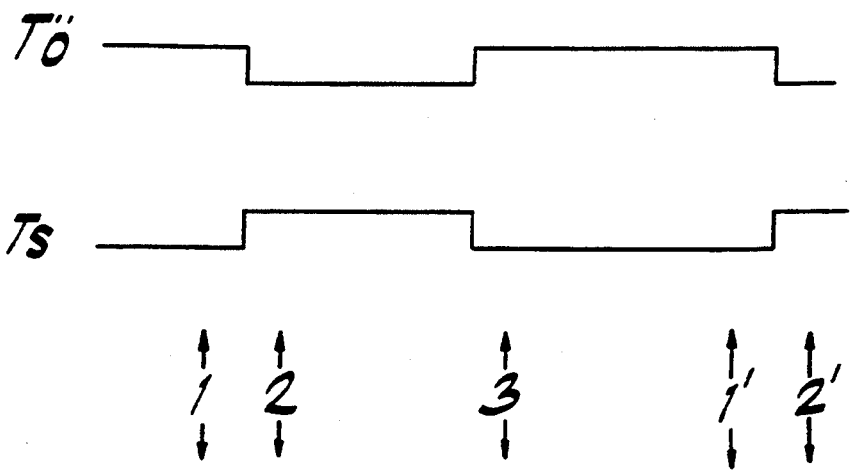
FIG. 6 shows a diagram illustrating the behavior of the potentials on the input and output terminals of the control logic device of a control apparatus for various defect cases with a bi-directional load.
Figure 6:
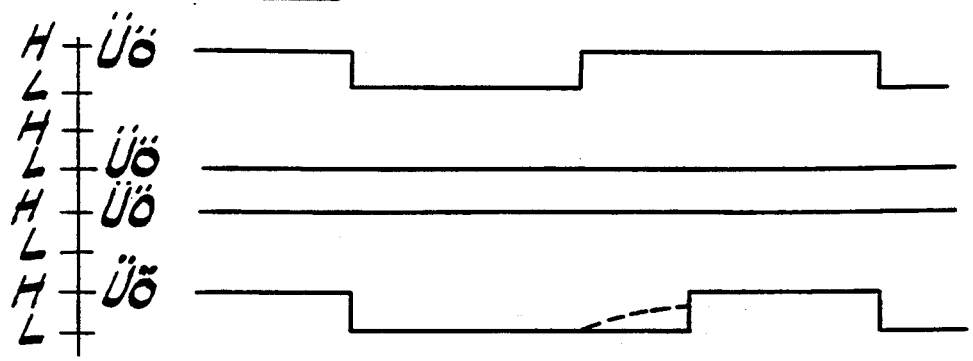
Figure 6:
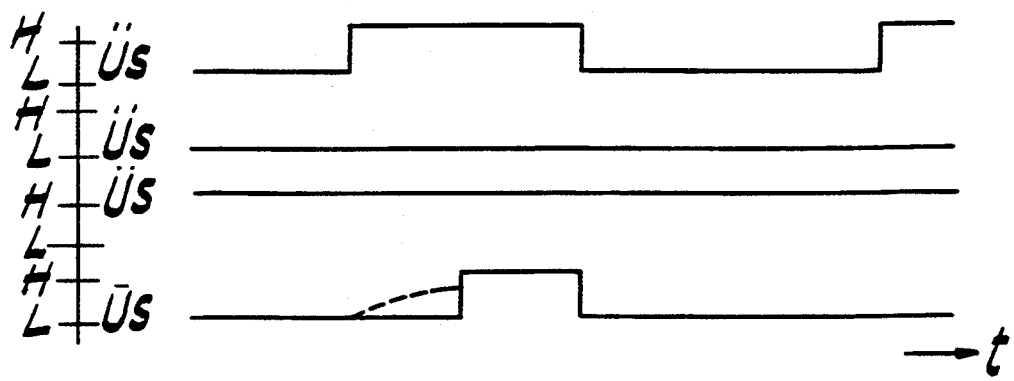

In FIG. 6, the behavior of the potential on the clock port T5 and Ts is shown in conjunction with the behavior of the potentials on the input port Üö and Üs to show the different defect possibilities. The diagram shows the interrogation times "1", "2" and "3" for a first switching event, and in addition the interrogation times "1'" and "2'" for a further switching event. The topmost diagram of the potentials on the port Üö shows the case in which there is neither a short-circuit to ground or to the voltage supply nor a cable failure. The second diagram shows a short-circuit to ground, the third a short-circuit to the supply voltage, for example to the battery voltage of a motor vehicle. Finally, the lowermost diagram of the terminal Üö shows the behavior of the potential in the event of a cable failure.

The behavior of the potential on the terminal Üs is shown at the bottom in the diagram according to FIG. 6, there being no defects in the topmost diagram, a short-circuit to ground in the second diagram, and a short-circuit to the supply voltage in the third diagram. Finally, the lowermost diagram shows the behavior of the potential as occurs in the event of a failure of the connecting cable to the load. The behavior of the potential on the capacitor of the RC element is shown dotted.

Direct differentiation between the individual defect cases is possible here. The principle of functional monitoring is, fundamentally, identical to that for the circuit according to FIG. 1. In particular, the interrogation results of a subsequent switching event are also evaluated here, if a defect is confirmed at time "3" of the first switching event. The delayed report back of the switching event is based on the effect of the RC element. What has been said in conjunction with FIG. 2 applies here.

Finally, it can be seen that, for the various usage variants of the functional monitoring method and the device for functional monitoring of an electrical load, all defects, that is to say a short-circuit to ground or to the supply voltage as well as an interruption in the supply line to the electrical load, can be detected. In this case, unambiguous differentiation between the various defect cases is possible. It can immediately be seen that the cost for detecting and differentiating between defects is relatively low. It is even possible to supplement an existing circuit at low cost such that it is possible to easily differentiate between the defect cases.

The simple construction of the defect detection circuit ensures that the probability of additional defects because of the functional monitoring circuit is low.

It can also be seen that only one port of the control logic device needs to be used for detecting and differentiating between the various defect cases. In this case, for the method and for the device it is irrelevant whether this is an analog or a digital port of the logic circuit. In this case, it is unnecessary for this port to be designed as an interrupt port.

We claim:

1. A method for monitoring an electrical load, comprising the steps of:
    transmitting a control signal from a control circuit to the electrical load, the control signal containing a switching pulse, the switching pulse changing from a first value to a second value and then to the first value;
    influencing a status signal with an RC element, the status signal being supplied by the electrical load in response to the control signal;
    making a single first comparison of the control signal to the status signal and a first time before the switching pulse to provide a first comparison result;
    making a single second comparison of the control signal to the status signal at a second time during the switching pulse to provide a second comparison result;.
    making a single third comparison of the control signal to the status signal at a third time after the switching pulse to provide a third comparison result; and
    forming a comparison triplet from the first, second, and third comparison results, a first value of the comparison triplet indicating that the electrical load is short-circuited to ground, a second value of the comparison triplet indicating that the electrical load is short-circuited to a load supply voltage, a third value of the comparison triplet indicating an interruption in a line coupled to the electrical load, the first, second, and third values being different, thereby distinguishing between the electrical load being short-circuited to ground, the electrical load being short-circuited to the load supply voltage and an interruption in the line coupled to the electrical load.

2. The method as recited in claim 1, wherein a resistive element of the RC element is coupled between the load supply voltage and the electrical load, and a capacitive element of the RC element is coupled between ground and the electrical load.

3. The method as recited in claim 1, wherein the first, second and third times are predetermined by the control circuit.

4. The method as recited in claim 1, wherein the electrical load includes an injection valve.

5. The method as recited in claim 1, wherein the electrical load includes a bipolar unit.

6. The method as recited in claim 5, wherein the bipolar unit includes a two-winding rotary actuator.

7. A device for monitoring an electrical load, comprising:
    a control circuit having an output for coupling to the electrical load, the control circuit transmitting a control signal to the electrical load, the control signal containing a switching pulse, the switching pulse changing from a first value to a second value and then to the first value;
    an RC element coupled to an input of the control circuit, the RC element including a resistor and a capacitor, the capacitor for coupling to the resistor and to the electrical load, the RC element influencing a status signal supplied by the electrical load in response to the control signal;
    the control circuit making a single first comparison of the control signal to the status signal at a first time before the switching pulse to provide a first comparison result, making a single second comparison of the control signal to the status signal at a second time during the switching pulse to provide a second comparison result, making a single third comparison of the control signal to the status signal at a third time after the switching pulse to provide a third comparison result, and forming a comparison triplet from the first, second, and third comparison results, a first value of the comparison triplet indicating that the electrical load is short-circuited to ground, a second value of the comparison triplet indicating that the electrical load is short-circuited to a load supply voltage, a third value of the comparison triplet indicating an interruption in a line coupled to the electrical load, the first, second, and third values being different, thereby distinguishing between the electrical load being short-circuited to ground, the electrical load being short-circuited to the load supply voltage, and an interruption in the line coupled to the electrical load.

8. The device as recited in claim 7, wherein the resistor of the RC element is coupled between the load supply voltage and the electrical load, and the capacitor of the RC element is coupled between ground and the electrical load.

9. The device as recited in claim 7, wherein the control circuit includes a time control circuit.

10. A method for monitoring an electrical load, comprising the steps of:
    transmitting a control signal from a control circuit to the electrical load, the control signal containing a switching pulse, the switching pulse changing from a first value to a second value and then to the first value;
    influencing a status signal with an RC element, the status signal being supplied by the electrical load in response to the control signal;
    making a single first comparison of the control signal to the status signal at a first time before the switching pulse to provide a first comparison result;
    making a single second comparison of the control signal to the status signal at a second time during the switching pulse to provide a second comparison result;
    making a single third comparison of the control signal to the status signal at a third time after the switching pulse to provide a third comparison result; and
    differentiating between the electrical load being short-circuited to ground, the electrical load being short-circuited to a load supply voltage, and an interruption in a line coupled to the electrical load as a function of the first, second, and third comparison results.

11. A device for monitoring an electrical load, comprising:
    a control circuit having an output for coupling to the electrical load, the control circuit transmitting a control signal to the electrical load, the control signal containing a switching pulse, the switching pulse changing from a first value to a second value and then to the first value;
    an RC element coupled to an input of the control circuit, the RC element including a resistor and a capacitor, the capacitor for coupling to the resistor and to the electrical load, the RC element influencing a status signal supplied by the electrical load in response to the control signal;
    the control circuit making a single first comparison of the control signal to the status signal at a first time before the switching pulse to provide a first comparison result, making a single second comparison of the control signal to the status signal at a second time during the switching pulse to provide a second comparison result, making a single third comparison of the control signal to the status signal at a third time after the switching pulse to provide a third comparison result, and differentiating between the electrical load being short-circuited to ground, the electrical load being short-circuited to a load supply voltage, and an interruption in a line coupled to the electrical load as a function of the first, second, and third comparison results.

* * * * *

UNITED STATES PATENT AND TRADEMARK OFFICE
CERTIFICATE OF CORRECTION

PATENT NO. : 5,430,438
DATED : July 4, 1995
INVENTOR(S) : Joos, et al.

It is certified that error appears in the above-indentified patent and that said Letters Patent is hereby corrected as shown below:

Column 1, line 6, "1991" should be --1992--.

Column 7, line 4, "T5" should be --Tö--.

Signed and Sealed this

Twelfth Day of March, 1996

Attest:

BRUCE LEHMAN

*Attesting Officer*     *Commissioner of Patents and Trademarks*